US007841278B2

(12) United States Patent
Schlörholz et al.

(10) Patent No.: US 7,841,278 B2
(45) **Date of Patent: *Nov. 30, 2010**

(54) METHOD AND APPARATUS FOR TREATING A RE-IMAGEABLE PRINTING FORM, MACHINE FOR PROCESSING PRINTING MATERIAL AND METHOD FOR TREATING A SURFACE MAKING CONTACT WITH PRINTING MATERIAL

(75) Inventors: Matthias Schlörholz, Heidelberg (DE); Martin Gutfleisch, Dossenheim (DE); Harald Latzel, Heidelberg (DE); Michaela Hoffmann, Herzogenrath (DE); Gerald Erik Hauptmann, Bammental (DE); Uwe Tessmann, Schwetzingen (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 11/960,028

(22) Filed: Dec. 19, 2007

(65) Prior Publication Data

US 2008/0160450 A1 Jul. 3, 2008

(30) Foreign Application Priority Data

Dec. 20, 2006 (DE) ....................... 10 2006 060 292

(51) Int. Cl.
*G03F 7/00* (2006.01)

(52) U.S. Cl. ....................... 101/456; 101/467; 101/478; 430/270.1; 430/302; 430/401

(58) Field of Classification Search ............. 430/270.1, 430/302

See application file for complete search history.

(56) References Cited

U.S. PATENT DOCUMENTS 3,640,863 A * 2/1972 Okuno et al. ............... 430/114
3,892,575 A * 7/1975 Watts et al. ................. 430/532
4,729,310 A * 3/1988 Love, III ..................... 101/157
6,423,468 B1 7/2002 Hotta et al.
6,637,336 B2 10/2003 Suda et al.

(Continued)

FOREIGN PATENT DOCUMENTS

DE 10121827 A1 12/2002

(Continued)

*Primary Examiner*—Cynthia H Kelly
*Assistant Examiner*—Chanceity N Robinson
(74) *Attorney, Agent, or Firm*—Laurence A. Greenberg; Werner H. Stemer; Ralph E. Locher

(57) ABSTRACT

A method for treating a re-imageable printing form includes surface modifying a surface of the printing form acting as a printing area in a nanoscopic range by chemically functionalizing the surface through covering with molecules, in particular amphiphilic molecules or polymers. The printing form is subjected to a primary process of imaging by laser radiation, and subjected to a primary process of application of at least one lithographic fluid, for example dampening solution, printing ink and/or varnish. The molecules are fixed in image regions by the primary process of imaging. The molecules are removed in non-image regions substantially by at least one primary process different than the application of printing ink, in particular by imaging, application of dampening solution or chemical developing. An apparatus for treating a re-imageable printing form, a machine for processing printing material and a method for treating a surface contacting printing material, are also provided.

11 Claims, 2 Drawing Sheets

U.S. PATENT DOCUMENTS

| | | | | |
|---|---|---|---|---|
| 6,782,824 | B2 | 8/2004 | Schneider | |
| 6,851,366 | B2 | 2/2005 | Gutfleisch et al. | |
| 7,485,397 | B2 * | 2/2009 | Eck et al. | 430/19 |
| 2002/0093561 | A1 | 7/2002 | Ozaki et al. | |
| 2004/0090516 | A1 | 5/2004 | Grützmacher et al. | |
| 2005/0112336 | A1 * | 5/2005 | Bourdelais et al. | 428/195.1 |
| 2007/0160928 | A1 * | 7/2007 | Yamada et al. | 430/270.1 |
| 2007/0224544 | A1 * | 9/2007 | Schlorholz et al. | 430/302 |
| 2008/0152798 | A1 * | 6/2008 | Pasuch et al. | 427/154 |
| 2008/0226322 | A1 * | 9/2008 | Bernsdorf et al. | 399/67 |

FOREIGN PATENT DOCUMENTS

| | | | |
|---|---|---|---|
| DE | 10227054 | A1 * | 12/2003 |
| DE | 10241671 | A1 | 3/2004 |
| DE | 102005021346 | A1 | 2/2006 |
| EP | 1002643 | A1 | 5/2000 |
| EP | 1211064 | B1 | 6/2002 |
| WO | WO 2005070691 | A1 * | 8/2005 |

* cited by examiner

METHOD AND APPARATUS FOR TREATING A RE-IMAGEABLE PRINTING FORM, MACHINE FOR PROCESSING PRINTING MATERIAL AND METHOD FOR TREATING A SURFACE MAKING CONTACT WITH PRINTING MATERIAL

CROSS-REFERENCE TO RELATED APPLICATION

This application claims the priority, under 35 U.S.C. §119, of German Patent application DE 10 2006 060 292.7, filed Dec. 20, 2006; the prior application is herewith incorporated by reference in its entirety.

BACKGROUND OF THE INVENTION

Field of the Invention

The present invention relates to a method for treating a re-imageable printing form having a surface acting as a printing area being surface modified in the nanoscopic range by chemically functionalizing the surface through covering with molecules. The printing form is subjected to a primary process of imaging by way of laser radiation, and is subjected to a primary process of an application of at least one lithographic fluid. The molecules are fixed in image regions by the primary process of imaging. The present invention also relates to a method for treating a surface making contact with printing material. The present invention furthermore relates to an apparatus for carrying out the method and a machine for processing printing material.

Methods of the generic type are used, inter alia, for manufacturing or imaging/re-imaging printing surfaces, for example printing plates, and for manufacturing surfaces which come into contact with printing material, for example cylinder covers. Surfaces which are manufactured in that way are used, in particular, in printing units or the sheet transport path of a machine which processes printing material sheets, for example a lithographic offset printing press which processes paper sheets or paperboard sheets.

There is always a desire to use exchangeable surfaces such as printing forms or cylinder covers multiple times, in order to minimize the production costs for printed products. Re-imageable printing forms and re-coatable cylinder covers are therefore already used in printing presses: re-imageable printing forms can be used for a number of different print jobs and re-coatable cylinder covers can be repaired or refreshed if wear phenomena occur as a result of the constant contact with printing material.

German Published, Non-Prosecuted Patent Application DE 102 27 054 A1, corresponding to U.S. Pat. No. 6,851,366, discloses a reusable or re-imageable printing form having a printing area, for example made from natively oxidized titanium, the printing area being covered with an amphiphilic compound which binds strongly to the surface. The printing form can be imaged point by point with the use of an infrared laser. For that purpose, the covering is removed or desorbed in the non-image regions with the use of the laser radiation, and hydrophilic surface regions are produced in the process. A treatment, in particular a laser treatment of the hydrophobic covering in image regions, is not provided. However, the desorption of strongly binding compounds is possible only with a relatively high laser power output, for example (titanium surface, phosphonic acid, imaging wavelength of 1100 nm) with a power output of approximately 3 watts and a fluence of from approximately 6 to approximately 20 J/cm$^2$, preferably approximately 12 J/cm$^2$.

German Published, Non-Prosecuted Patent Application DE 102 41 671 A1, corresponding to U.S. Patent Application Publication No. US 2004/0090516, discloses an element which makes contact with printing material, for example the surface of a perfecting cylinder, having an ink-repelling coating on a surface of a microstructured carrier. The coating has an amphiphilic compound. Strongly binding compounds are mentioned as examples.

European Patent EP 1 211 064 B1, corresponding to U.S. Pat. No. 6,637,336, discloses a re-imageable printing form having a printing area, for example made from titanium oxide, which, in order to produce a hydrophobic surface, is provided with a monolayer of a hydrophobic organic compound, for example a fatty acid dextrin, and is dried actively by evaporation with the use of a dryer. The coated printing area is imaged with infrared radiation, as a result of which fixing of the monolayer occurs in image regions. In non-image regions, the hydrophobic layer or the hydrophobic compound is subsequently washed off actively by spraying on water, which is to be distinguished from the dampening solution that is used later, or an aqueous washing solution, that is to say by an active washing operation, or is removed by the ink application, that is to say by the tack (adhesiveness) of the ink which is applied in the process. The hydrophilic surface of the titanium oxide is therefore exposed for receiving dampening solution.

German Published, Non-Prosecuted Patent Application DE 10 2005 021 346 A1 discloses a switchable layer which can be used on a printing plate. To that end, for example, an aluminum sheet is coated with titanium oxide. A titanium oxide sol is applied to the latter and tempered, with the result that a hydrophilic surface is produced. The layer which is obtained in that way is wetted with polyacrylic acid, dried and subsequently treated with a combination of ultraviolet and infrared radiation, with the result that a hydrophobic surface is produced. Subsequently, it is imaged with the use of infrared radiation having an intensity below the ablation threshold, with the result that hydrophilic image regions are produced.

BRIEF SUMMARY OF THE INVENTION

It is accordingly an object of the invention to provide a method and an apparatus for treating a re-imageable printing form, a machine for processing printing material and a method for treating a surface making contact with printing material, which overcome and are improved in comparison with at least one of the hereinafore-mentioned disadvantages of the heretofore-known devices and methods of this general type.

It is a further or alternative object of the present invention to provide a method which is improved in comparison with the prior art and makes simple treatment possible, in particular the manufacture, imaging or re-imaging of a re-imageable printing form. It is a further or alternative object of the present invention to provide a method which is improved in comparison with the prior art and which makes a simple treatment possible, in particular the manufacture of a surface which makes contact with printing material. A simple treatment can be characterized by a small number of process steps, the combination of process steps and/or the carrying out of process steps which are otherwise known.

It is a further or alternative object of the present invention to provide an apparatus for carrying out the treatment methods for printing forms and surfaces which make contact with printing material.

It has been discovered that certain amphiphilic molecules are not removed from a surface or desorbed at a defined laser power output or a defined range of the laser power output, but are fixed on the surface. However, the amphiphilic molecules are removed from the surface at a higher laser output than the defined laser output. The expression "fixing" should therefore be understood in this application as follows: a fixed covering (that is to say, molecules which are fixed on a surface by laser radiation) is modified, preferably photochemically or photothermally, by the fixing in such a way that, in comparison with a non-fixed covering, a modification, in particular an improvement of the chemical character, for example the hydrophilic/hydrophobic character, and/or the binding state with respect to the surface, takes place. Fixed molecules are removed, in particular, by the method step of removal by application of a lithographic fluid and are substantially not removed from the surface by the method step of printing. In particular, the covering is preferably hydrophobicized, that is to say it shows a hydrophobic surface property, by the fixing, irrespective of the wetting properties before the fixing. Furthermore, fixing means, in particular, that the fixed molecules form a (preferably hydrophobic) covering which is preferably sufficiently stable for the requirements and the duration of the printing process.

The expression "removal" is to be understood in this application as follows: removed molecules are actually desorbed from the surface or at least modified, for example destroyed, in such a way that their action which influences the surface property (hydrophobic/hydrophilic) of the surface is reduced, canceled or reversed.

The "nanoscopic range" is to be understood in this application as the range which is smaller than 100 nm, in particular smaller than 10 nm.

With the foregoing and other objects in view there is provided, in accordance with the invention, a method for treating a re-imageable printing form. The method comprises surface modifying a surface of the printing form acting as a printing area in a nanoscopic range by chemically functionalizing the surface through covering with molecules. The printing form is subjected to a primary process of imaging by laser radiation and is subjected to a primary process of an application of at least one lithographic fluid. The molecules are fixed in image regions by the primary process of imaging. The molecules are removed in non-image regions substantially by at least one primary process different than an application of a printing ink.

According to the invention, one of the primary processes (imaging, application or else developing) is used for the removal of the molecules, as a result of which the method can be carried out simply. In contrast, a separate operation which is based on a washing or cleaning step, as is described in the prior art, is not used.

One advantage of the invention which results from the fixing is the possibility to use, or to cover with, molecules which only weakly bind initially. As a result of the fixing, the chemical character of the molecules or the binding of the molecules to the surface is improved with regard to the requirements and the duration of the printing process.

A further advantage of the invention results from the fact that the power output for the radiation-based fixing and removing, if weakly binding molecules are used, can be reduced in comparison with the power output for the radiation-based removal of strongly binding molecules.

In accordance with another mode of the invention, which is advantageous with regard to the ability to be carried out simply due to the application of method steps which are known elsewhere, and which is therefore preferred, can be distinguished by the fact that the printing form is subjected additionally to the primary process of developing, in particular by application of a gumming solution. The primary process of developing can therefore advantageously likewise be used for removal.

In accordance with a further mode of the invention, the printing form is subjected additionally to at least one of the secondary processes of cleaning, washing, rinsing and drying.

In accordance with an added mode of the invention, which is advantageous with regard to simple removal and is therefore preferred, can be distinguished by the fact that the molecules are fixed by imaging by way of laser radiation at a first power output, and by the fact that the molecules are removed by imaging by way of laser radiation at a second power output which is different than the first power output. Removal or desorption can also take place by large-surface-area radiation with coherent or incoherent electromagnetic radiation, using a wavelength which is different than the wavelength that is used for fixing and in which the fixed molecules display no interaction or a considerably lower interaction than the non-fixed molecules.

In accordance with an additional mode of the invention, which is advantageous with regard to the ability to be carried out simply due to the use of method steps that are known elsewhere, and is therefore preferred, can be distinguished by the fact that the application of the lithographic fluid includes dampening of the printing form with a dampening solution which is different than a washing solution. The primary process of application, in particular the application of dampening solution, can therefore advantageously likewise be used for removal.

In accordance with yet another mode of the invention, which is advantageous with regard to the compounds that are used and is therefore preferred, can be distinguished by the fact that the surface of the printing form is covered with molecules by covering with amphiphilic molecules or polymers, in particular with saccharides.

With the objects of the invention in view, there is also provided a method for treating a surface making contact with printing material. The method comprises surface modifying the surface making contact with printing material in a nanoscopic range by chemically functionalizing the surface through covering with molecules, and subjecting the surface to fixing of the molecules by laser radiation.

The fixing of the molecules according to the invention also leads to the advantage that molecules which only weakly bind initially can be used.

In accordance with still another mode of the invention, which is advantageous with regard to the compounds that are used and is therefore preferred, can be distinguished by the fact that the surface is covered with molecules by covering with amphiphilic molecules or polymers, in particular with saccharides.

With the objects of the invention in view, there is also provided an apparatus for treating a re-imageable printing form. The apparatus comprises a laser having a switchable power output.

If a switchable laser is used, it is possible in a simple way, to fix molecules in image regions at a lower power output and to remove molecules in non-image regions at a higher power output. In this case, the imaging duration is not extended substantially.

In accordance with another mode of the invention, which is advantageous with regard to simple switchability and is therefore preferred, can be distinguished by the fact that the switchable laser has an acousto-optical modulator.

With the objects of the invention in view, there is concomitantly provided a machine for processing printing material, in particular a printing press or a rotary printing press processing sheets for lithographic offset printing, comprising at least one apparatus according to the invention.

The machine which processes printing material is preferably a rotary printing press that processes sheets for lithographic offset printing, in particular wet offset printing. The printing material can be paperboard, film or preferably paper. The printing press can be operated in recto printing operation or preferably in recto and verso printing operation. The printing press can provide the printing material with single color printed images or preferably with multiple color printed images. In the transport direction of the printing material, the printing press can include a feeder, a feed table, a plurality of printing units, a turning device, further printing units, a varnishing unit, a dryer, a powdering device and/or a delivery. The printing press can include an operating desk and a control unit.

The above-described invention and the above-described, advantageous developments of the invention, also represent advantageous developments of the invention in any desired combination with one another.

Other features which are considered as characteristic for the invention are set forth in the appended claims.

Although the invention is illustrated and described herein as embodied in a method and an apparatus for treating a re-imageable printing form, a machine for processing printing material and a method for treating a surface making contact with printing material, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

When carrying out the following different exemplary embodiments of the method according to the invention for treating, in particular for imaging or re-imaging, primary processes take place, as well as secondary processes if necessary or desired in the exemplary embodiment. In this case, the secondary processes carry out an action which merely assists the method or improves the method while the primary processes, if they are not denoted as optional, are indispensable for the method.

In the first two exemplary embodiments, the chemical material classes of amines, carbonic acids, or sulfonic acids (or their respective esters) are suitable as amphiphilic molecules for covering or coating. The adsorptive character thereof is low according to experience and the binding state thereof with respect to the surface is improved by fixing according to the invention.

Furthermore, what are known as geminis or surfynols are suitable as amphiphilic molecules for covering in the first two exemplary embodiments. Descriptions of the substances can be found in:

F. M. Menger, J. S. Keiper (1981), "Gemini Tenside" [Gemini surfactants] Angewandte Chemie [Applied Chemistry] 112: 1980-1996.

R. Zana, M. Benrraou and R. Rueff (1991), "Alkanediyl-a,w-bis(dimethylalkylammonium bromide) surfactants. 1. Effect of the spacer chain length on the critical micelle concentration and micelle ionization degree" Langmuir 7(6): 1072-5.

F. Devinsky, L. Masarova and I. Lacko (1985), "Surface activity and micelle formation of some new bisquaternary ammonium salts" Journal of Colloid and Interface Science 105(1): 235-9.

F. M. Menger and C. A. Littau (1991), "Gemini-surfactants: synthesis and properties" Journal of the American Chemical Society 113(4): 1451-2.

EXAMPLES

Carbonic acids (I) or salts of the carbonic acids (II)

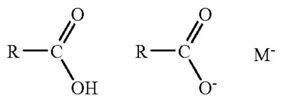

Sulfonic acids (III) or salts of the sulfonic acids (IV)

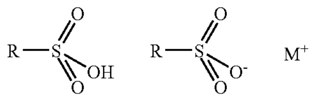

cationic geminis (V)

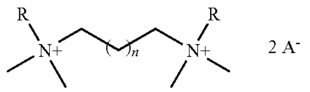

where R=aliphatic, aromatic or partially aliphatic radical i. M+=cationic counterion, for example: Na+, K+, NH4+, N(CH3)4+ ii. A−=anionic counterion, for example: Br−, Cl−, I−, ½SO42− iii. n≧0.

Furthermore, in the first two exemplary embodiments, the following initially weakly adsorbing and fixable polymers are suitable for covering: polycondensates, polyhydroxylcarbonyls, carbohydrates/saccharides, polyglucosans, linear polyglucosans, starch or preferably dextrins. In particular, solutions of gum arabic or gumming solutions are suitable. However, the use of photochemical components in the polymer or polymer systems (radical starter, crosslinker, copolymers), which are necessary in conventional microscopic polymer coatings, can advantageously be omitted.

After covering, most of the above-mentioned molecules display initially hydrophilic or only weakly hydrophobic properties and, only after fixing, at least weakly hydrophobic properties.

Figure 1:
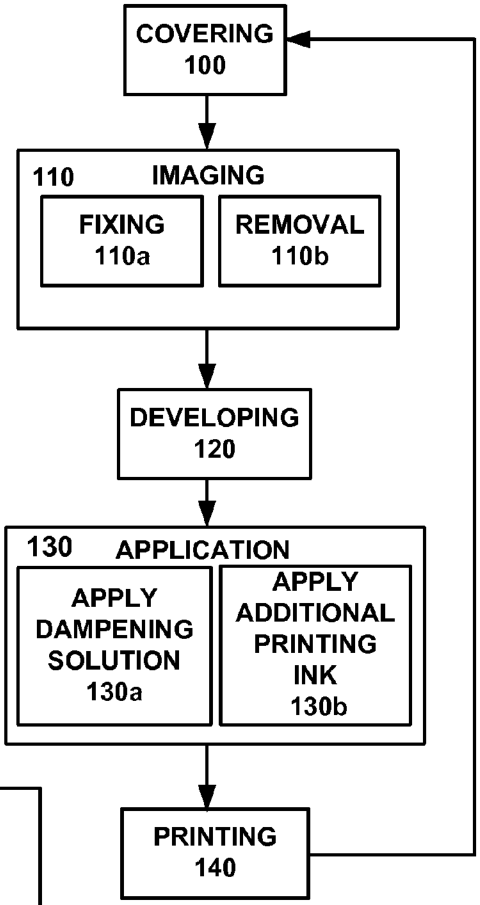
FIG. 1 is a flow chart of a first exemplary embodiment of the method according to the invention.

Referring now to the figures of the drawings in detail and first, particularly, to FIG. 1 thereof, there is seen a flow chart of a first exemplary embodiment of the method according to the invention.

In a method step 100 (covering; primary process), a surface, which acts as a printing or image area, of a re-imageable printing form, is surface modified in the nanoscopic range, due to the surface being functionalized chemically by covering with molecules. In this case, the covering preferably takes place from an aqueous or ethanolic solution.

In a method step 110 (imaging; primary process), the covered surface is imaged by way of laser radiation. The method step 110 is divided into method steps which preferably run in parallel, namely fixing 110*a* of the molecules in image regions (hydrophobic, ink-carrying regions) and removal 110*b* or desorption of the molecules in non-image regions (hydrophilic regions which carry dampening solution). The fixing 110*a* in image regions preferably takes place by imaging by way of laser radiation at a first power output L1 (different than zero). The removal 110*b* in non-image regions preferably takes place by imaging by way of laser radiation at a second power output L2 (likewise different than zero) which is different than the first power output. The first power output L1 in the image regions is preferably lower than the second power output L2 in the non-image regions (L1<L2). Furthermore, the power output of the laser which is used/the laser radiation is preferably varied during treatment or when moving over the printing form surface in a spatially resolved manner.

The following text describes one preferred example: a titanium sheet printing form is covered with stearin hydroxamic acid and is imaged by way of an infrared fiber laser having a wavelength of 1100 nm. In this case, the first power output L1 is selected or switched to be approximately 1 watt and the second power output L2 is selected or switched to be approximately 5 watts, through an acousto-optical modulator.

The following text describes a further preferred example: an aluminum sheet or titanium sheet printing form is first of all cleaned (secondary process), if required. Then, the surface is covered with polymers by a thin layer of a gumming solution which contains dextrins (for example, AgumO or AgumZ, Eggen-Chemie, diluted from approximately 1:1 to approximately 1:20 with deionized water) being applied with the use of an application unit and subsequently being removed as far as a nanoscopic surface covering by rinsing (secondary process) of the surface with deionized water. After this covering, the printing form is imaged by way of infrared laser radiation at a wavelength of 1064 nm and a power output of from approximately 1.0 watt to approximately 3.5 watts, or the covering is fixed in terms of the image. In non-image regions, in contrast, the polymer covering is removed with the use of laser radiation.

In an optional method step 120 (developing; primary process), the surface is developed, that is to say is preferably treated chemically, with the contrast, for example, between hydrophilic and hydrophobic regions of the printing form being reinforced. The developing preferably takes place by application of what is known as gumming solution, that is to say by what is known as gumming. However, a method without developing is preferred.

In a method step 130 (application; primary process), at least one lithographic fluid, for example dampening solution which is different than washing solution for printing forms and/or printing ink/varnish, is applied to the surface of the printing form. First of all a damping solution 130*a* and subsequently additionally printing ink 130*b*, are preferably applied to the surface, that is to say the printing form is dampened and inked.

In a method step 140 (printing), the inked printing form is preferably repeatedly printed on printing material and, as a result, at least one printed product is produced.

After printing, the printing form is available for renewed covering 100 and imaging 110, that is to say the method can be carried out multiple times as a circular process of re-imaging. In this case, cleaning of printing ink from the surface of the printed printing form can take place before or after the covering 100, for example, using Eurostar or isopropyl alcohol.

Furthermore, activation of the printing form surface, for example by UV radiation or atmospheric pressure plasma, can optionally take place before renewed covering or coating.

Figure 2:
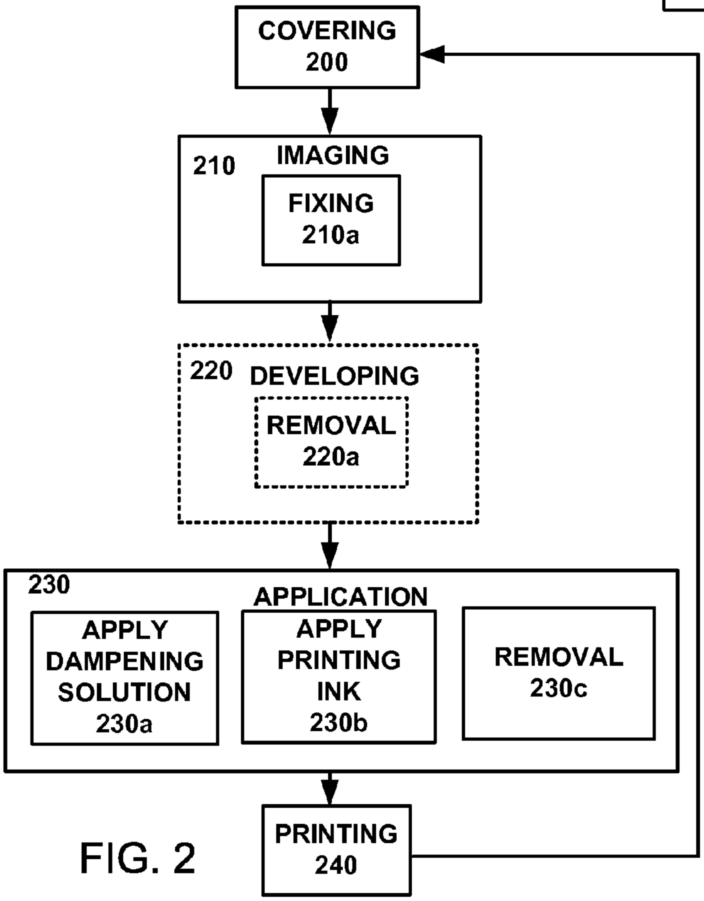
FIG. 2 is a flow chart of a second exemplary embodiment of the method according to the invention.

FIG. 2 shows a flow chart of a second exemplary embodiment of the method according to the invention.

In a method step 200 (covering; primary process), a surface, which acts as a printing area, of a re-imageable printing form, is surface modified in the nanoscopic range, due to the surface being functionalized chemically by covering with molecules. The covering preferably takes place from an aqueous or from an ethanolic solution.

In a method step 210 (imaging; primary process), the covered surface is imaged by way of laser radiation. The method step 210 includes the method step of fixing 210*a* of the molecules in image regions (hydrophobic, ink-carrying regions). The fixing 210*a* in image regions takes place by imaging by way of laser radiation at a defined power output (which is different than zero).

The following text describes one preferred example: a steel sheet or titanium sheet printing form (thickness, for example, approximately 0.125 mm) is cleaned with acetone (secondary process) and is activated for approximately 10 minutes with UV radiation of an excimer laser. Subsequently, the metal sheet is dipped for approximately 10 minutes into an approximately 1 mM aqueous solution of "Gemini 10-2-10",

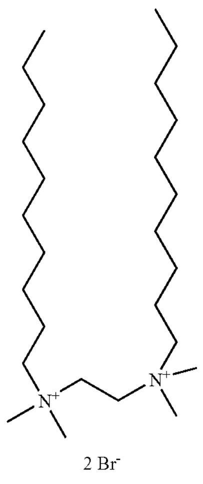

subsequently rinsed with water (secondary process) and blown dry with nitrogen (secondary process). The imaging or fixing takes place by way of laser radiation having a wavelength of 830 nm or 1064 nm at a power output of approximately 1.5 watts and having an imaging speed of approximately 2.5 m/s.

The following text describes a further preferred example: an aluminum sheet or titanium sheet printing form is first of all cleaned (secondary process), if required. The surface is then covered with polymers, by a thin layer of a gumming solution which contains dextrins (for example, AgumO or AgumZ, Eggen-Chemie, diluted from approximately 1:1 to approximately 1:20 with deionized water) being applied with the use of an application unit and subsequently being removed as far as a nanoscopic surface covering by rinsing (secondary process) of the surface with deionized water. After this covering, the printing form is imaged by way of infrared laser radiation at a wavelength of 1064 nm and a power output of from approximately 1.0 watt to approximately 3.5 watts, or the covering is fixed in terms of the image.

In an optional method step 220 (developing; primary process), the surface is developed. For example, the contrast between hydrophilic and hydrophobic regions of the printing form is reinforced. The developing preferably takes place by application of what is known as gumming solution, that is to say by what is known as gumming. However, a method without developing is preferred, in particular if a polymer covering is used.

The following text describes an alternative preferred example: a steel sheet or titanium sheet printing form (thickness, for example, approximately 0.125 mm) is cleaned with acetone (secondary process) and is activated for approximately 10 minutes with UV radiation of an excimer laser or with Sidol. Subsequently, the surface of the metal sheet is covered with what are known as "Zonyls" from the company Du Pont, for example "FSE", "FSP" or "9361", at concentrations between 0.05 mM and 1 mM from aqueous solution (Zonyls are: amphiphilic molecules having partially fluorinated hydrocarbon chains and having one or two anchor groups). The imaging takes place by way of infrared laser radiation at a power output of approximately 1 watt and at an imaging speed of approximately 2.5 m/s. Subsequently, the surface is gummed with AgumZ.

In a method step 230 (application; primary process), at least one lithographic fluid, for example dampening solution which is different than washing solution for printing forms and/or printing ink/varnish, is applied to the surface. Preferably, first of all dampening solution 230*a* and subsequently, at the same time, printing ink 230*b*, are applied to the surface of the printing form, that is to say the printing form is dampened and inked.

The removal 220*a*, 230*c* or the desorption of the molecules in non-image regions (ink-repelling regions) takes place substantially by the optional developing 220 or during the developing 220 (if developing is provided) and/or by the application 230 or during the application 230. If the removal 220*a* takes place by the optional developing 220, the molecules in the non-image regions are removed from the surface by a developing fluid, preferably by gumming solution. If the removal 230*c* takes place by the application 230, the molecules in the non-image regions are removed from the surface by a primary process which is different than the application of a printing ink, preferably by a dampening solution which is different than washing solution for printing forms.

In a method step 240 (printing), the imaged and inked printing form is preferably printed repeatedly on printing material and, as a result, at least one printed product is produced.

After printing, the printing form is available for renewed covering 200 and imaging 210, that is to say the method can be carried out multiple times as a circular process of re-imaging. In this case, cleaning of printing ink from the surface of the printed printing form can take place before or after the covering 200, using Eurostar or isopropyl alcohol.

Furthermore, activation of the printing form surface, for example by UV radiation or atmospheric pressure plasma, can optionally take place before renewed covering.

Although the two exemplary embodiments which are specified above relate to re-imageable, that is to say reusable, printing forms, the treatment of corresponding single-use printing forms is also possible.

As an alternative, it is also possible to carry out a modified method according to the invention for treating surfaces which come into contact with printing material, for example impression cylinder surfaces or covers. In accordance with the method step 200, a surface of this type can be covered with ink-repelling, amphiphilic molecules or polymers, in particular saccharides and, in accordance with the method step 210 or 210*a*, can be treated over its full surface area, preferably with infrared radiation, for fixing it. Removal of molecules is not necessary. A closed and ink-repelling surface can be produced by the fixing. If wear of the ink-repelling surface occurs as a result of the constant contact with the printing material, the surface can be covered again in a simple manner and the covering can be fixed.

As an addition to the method which is specified above, there can also be provision for a surface with a fixed covering to be renewed permanently during use, at least at damaged points, by the surface being offered molecules permanently, for example by the use of a dipping trough which contains a corresponding solution of the molecules, and by the molecules being fixed permanently.

In addition to the above-mentioned primary processes (covering, imaging, fixing, removal, optional developing, application), the above-described methods can also have secondary processes, for example cleaning/washing (for example, with acetone or isopropyl alcohol), rinsing (for example, with deionized water) and/or drying (for example, by blow drying with nitrogen).

Figure 3:
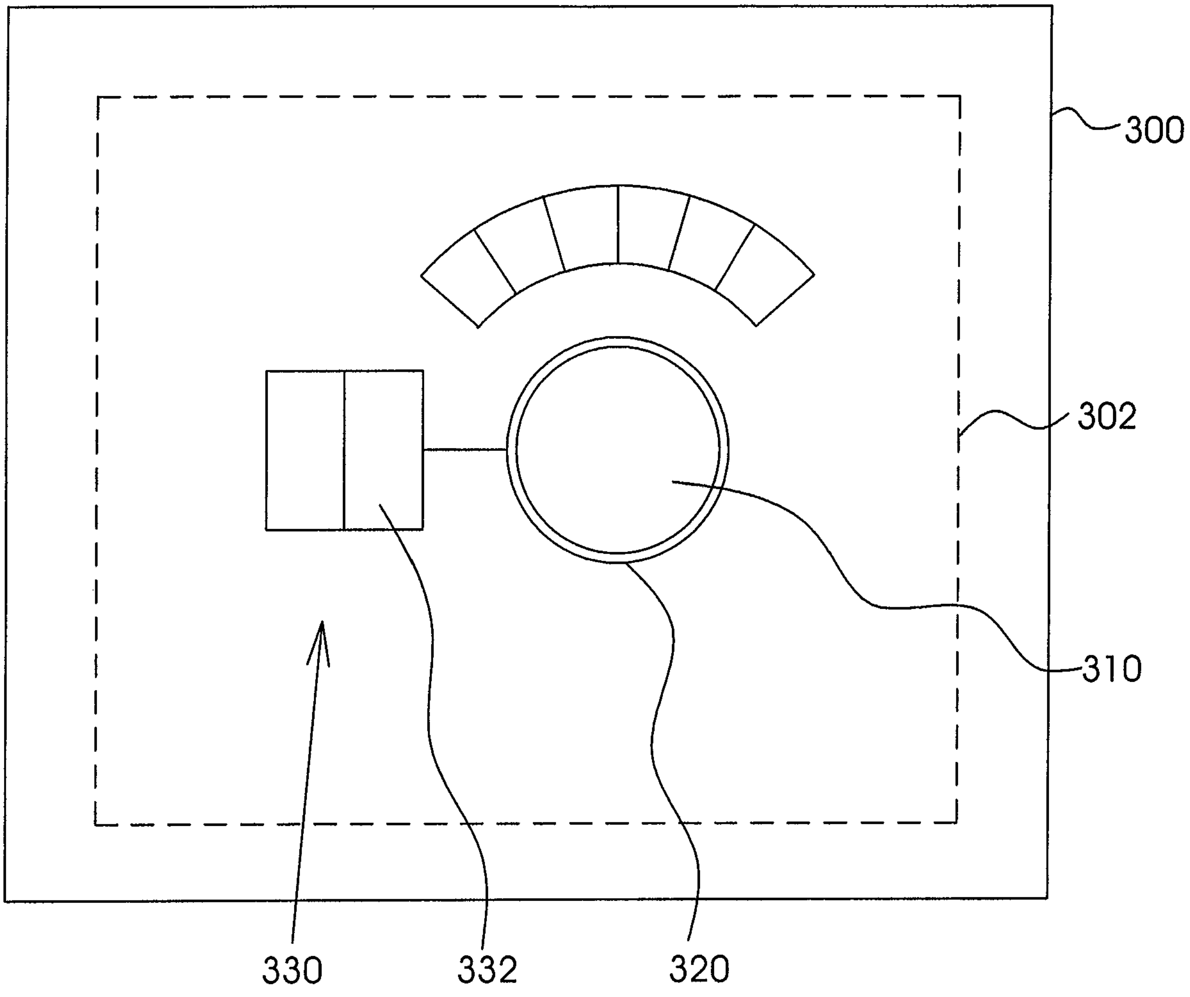
FIG. 3 is a diagrammatic, side-elevational view of an exemplary embodiment of an apparatus for carrying out the method according to the invention.

FIG. 3 shows one exemplary embodiment of an apparatus for carrying out the method according to the invention.

A machine 300 which processes printing material (or as an alternative: a separate treatment assembly, for example an exposer) has an apparatus 302 with a cylinder 310, the surface 320 of which is formed by the cylinder cover itself or by a surface which is received on the latter, for example a printing plate. Furthermore, the apparatus 302 has a laser 330, the power output of which can be switched using an acousto-optical modulator 332. The laser 330 serves to image the surface 320, for fixing and for removal. Finally, the apparatus 302 has further units for respectively carrying out the above-mentioned method steps (covering, developing, application, printing, cleaning, activating).

The invention claimed is:

1. A method for treating a re-imageable printing form, the method comprising the following steps:

surface modifying a surface of the printing form acting as a printing area in a nanoscopic range by chemically functionalizing the surface through covering with molecules, after covering the molecules display hydrophilic properties;

subjecting the printing form to a primary process of imaging by infrared laser radiation;

subjecting the printing form to a primary process of an application of at least one lithographic fluid;

fixing the molecules in image regions by the primary process of infrared imaging by laser radiation, after fixing the molecules display hydrophobic properties; and removing the molecules in non-image regions substantially by at least one primary process different than an application of a printing ink.

2. The method according to claim 1, which further comprises additionally subjecting the printing form to a primary process of developing.

3. The method according to claim 2, which further comprises carrying out the primary process of developing by an application of a gumming solution.

4. The method according to claim 1, which further comprises additionally subjecting the printing form to at least one secondary process selected from the group consisting of cleaning, washing, rinsing and drying.

5. The method according to claim 1, which further comprises:

fixing the molecules by imaging through laser radiation at a first power output; and removing the molecules by imaging through laser radiation at a second power output different than the first power output.

6. The method according to claim 1, which further comprises carrying out the step of the application of the at least one lithographic fluid by dampening the printing form with a dampening solution different than a washing solution.

7. The method according to claim 1, which further comprises carrying out the step of covering the surface of the printing form with molecules by covering with amphiphilic molecules or with polymers.

8. The method according to claim 1, which further comprises carrying out the step of covering the surface of the printing form with molecules by covering with saccharides.

9. A method for treating a surface making contact with printing material, the method comprising the following steps:

surface modifying the surface making contact with printing material in a nanoscopic range by chemically functionalizing the surface through covering with molecules, after covering the molecules display hydrophilic properties; and subjecting the surface to fixing of the molecules by infrared laser radiation, after fixing the molecules display hydrophobic properties.

10. The method according to claim 9, which further comprises carrying out the step of covering the surface with molecules by covering with amphiphilic molecules or polymers.

11. The method according to claim 9, which further comprises carrying out the step of covering the surface with molecules by covering with saccharides.

* * * * *